United States Patent
Eid et al.

(10) Patent No.: US 8,254,200 B2
(45) Date of Patent: Aug. 28, 2012

(54) SYSTEM AND METHOD TO COMPENSATE FOR PROCESS AND ENVIRONMENTAL VARIATIONS IN SEMICONDUCTOR DEVICES

(76) Inventors: Sherif Eid, Sunnyvale, CA (US); Morgan Andrew Whately, San Francisco, CA (US); Sandeep Krishnegowda, Santa Clara, CA (US)

( * ) Notice: Subject to any disclaimer, the term of this patent is extended or adjusted under 35 U.S.C. 154(b) by 151 days.

(21) Appl. No.: 12/879,643

(22) Filed: Sep. 10, 2010

(65) Prior Publication Data
US 2011/0063937 A1    Mar. 17, 2011

(51) Int. Cl.
G11C 5/14    (2006.01)
(52) U.S. Cl. .................. 365/226; 365/227; 365/229
(58) Field of Classification Search .............. 365/226, 365/227, 229
See application file for complete search history.

(56) References Cited

U.S. PATENT DOCUMENTS

| | | | |
|---|---|---|---|
| 5,592,430 A * | 1/1997 | Ohtsuki ................ | 365/226 |
| 6,496,439 B1 * | 12/2002 | McClure ............... | 365/229 |
| 6,788,089 B2 * | 9/2004 | Van Lammeren et al. | 324/750.3 |
| 7,020,818 B2 | 3/2006 | Dour et al. | |
| 7,157,932 B2 | 1/2007 | El-Kik et al. | |
| 7,651,905 B2 | 1/2010 | Kapoor | |
| 7,652,916 B2 | 1/2010 | Shepard | |
| 7,671,663 B2 * | 3/2010 | Houston et al. ........ | 327/534 |
| 7,692,976 B2 | 4/2010 | Cheng | |
| 7,812,639 B2 * | 10/2010 | Lai et al. ............. | 326/86 |
| 2003/0058563 A1 | 3/2003 | Blake et al. | |

FOREIGN PATENT DOCUMENTS
WO    2009058141 A1    5/2009

OTHER PUBLICATIONS

Kim et al, "PVT-Aware Leakage Reduction for On-Die Caches with Improved Read Stability," IEEE Journal of Solid State Circuits, Jan. 2006, vol. 42, Issue 1, pp. 170-178; 9 pages.

* cited by examiner

Primary Examiner — Pho M Luu (57) ABSTRACT

An integrated circuit (IC) including a controller integrally formed on a shared die with the IC and method of operating the same to compensate for process and environmental variations in the IC are provided. In one embodiment the IC is comprised of device and sub-circuits, and the method includes: receiving in the IC electrical power and information on at least one of one or more operational parameters of the IC; and adjusting one or more operating characteristics of at least one of the devices and sub-circuits in the IC based on the received information using a controller integrally formed on a shared die with the IC. Other embodiments are also disclosed.

18 Claims, 10 Drawing Sheets

SYSTEM AND METHOD TO COMPENSATE FOR PROCESS AND ENVIRONMENTAL VARIATIONS IN SEMICONDUCTOR DEVICES

CROSS-REFERENCE TO RELATED APPLICATIONS

The present application claims the benefit of priority under 35 U.S.C. 119(e) to U.S. Provisional Patent Application Ser. No. 61/241,742 entitled "A Microcontroller Based PVT control system For A 65 nm 72 Mb Synchronous SRAM," filed Sep. 11, 2009, which application is hereby incorporated by reference in its entirety.

TECHNICAL FIELD

The present disclosure relates generally to semiconductor devices and more particularly to a system and method to compensating for process and environmental variations in an integrated circuit.

BACKGROUND

As scaling of integrated circuit technology continues more challenges emerge in dealing with process and environmental variations. Such variations directly affect operating margin, subthreshold leakage and speed in silicon complimentary-metal-oxide-semiconductor (CMOS) circuits including memory cores and periphery logic devices. Previous schemes or techniques attempting to address such operating margin problems relied on body-bias trimming and have not been wholly satisfactory.

SUMMARY

An integrated circuit (IC) including a controller integrally formed on a shared die with the IC and method of operating the same are provided to optimize operation of the IC to compensate for process and environmental variations in the IC, thereby improving speed or frequency, power consumption, data retention and/or subthreshold leakage of the IC. In one embodiment the IC is comprised of device and sub-circuits, and the method includes: receiving in the IC electrical power and information on at least one of one or more operational parameters of the IC; and adjusting one or more operating characteristics of at least one of the devices and sub-circuits in the IC based on the received information using a controller integrally formed on a shared die with the IC.

In one embodiment the IC includes a plurality of devices and sub-circuits, and a number of environmental sensors to sense changes in environmental conditions including one or more of temperature of the IC, voltage and current of electrical power supplied to the IC. A controller integrally formed on a shared die with the plurality of devices and sub-circuits adjusts operating characteristics of a number of the devices and sub-circuits in response to the sensed changes to meet a number of operational parameters for the IC.

BRIEF DESCRIPTION OF THE DRAWINGS

These and various other features of the PVT control system and methods of operating the same will be apparent upon reading of the following detailed description in conjunction with the accompanying drawings and the appended claims provided below, where:

DETAILED DESCRIPTION

The drawings described are only schematic and are non-limiting. In the drawings, the size of some of the elements may be exaggerated and not drawn to scale for illustrative purposes. The dimensions and the relative dimensions may not correspond to actual reductions to practice of the invention. For purposes of clarity, many of the details of integrated circuit fabrication and operation in general and semiconductor memories in particular, which are widely known and not relevant to the present system and method have been omitted from the following description.

Figure 1:
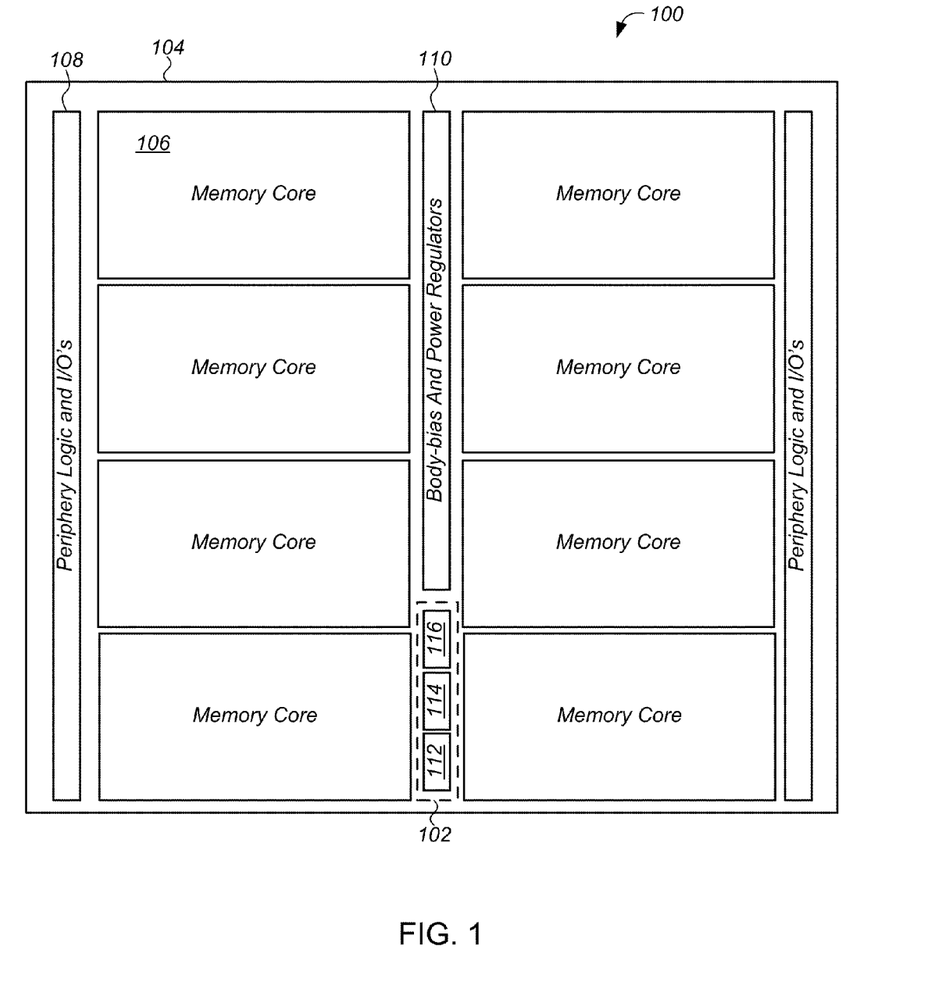
FIG. 1 is a block diagram of an integrated circuit (IC) including a process, voltage and temperature (PVT) control system according to one embodiment.

FIG. 1 is a simplified block diagram in top or plan view of an embodiment of an integrated circuit (IC) 100 including a process, voltage and temperature (PVT) control system 102 that is integrally formed on a shared die 104. The PVT control system 102 performs at least two functions. First, the PVT control system 102 is utilized to calibrate or adjust operating characteristics a number of devices and/or sub-circuits in the IC at wafer sort or testing to compensate for differences in operational parameters between ICs fabricated on a single substrate that can occur due to process variations across the die substrate, thereby increasing parametric yield of ICs. Second, the PVT control system 102 can be utilized during normal operation to dynamically adjust operating characteristics of at least some of the devices and/or sub-circuits to compensate for variations in performance arising from changing environmental or IC operational conditions, such as changes in IC temperature or changes in voltage or electrical current supplied to the IC. Devices and sub-circuits for which operating characteristics may be adjusted can include one or more power regulators, body-bias generators, current references, voltage references, current scaling circuits, delay-circuits, built-in-self-test (BIST) circuits and phase (PLLs). Operating characteristics adjusted can include one or more voltages, currents, time delays and frequency multiplication factors. Operational parameters can include speed, delay time, data retention, leakage current, threshold voltages, and power consumption.

In the embodiment shown in FIG. 1, the IC 100 is a semiconductor memory, such as a dynamic random access memory (DRAM) or static random access memory (SRAM), including one or more memory cores 106 that may be used to store data and/or programs for use in an electronic computer. In addition to the memory core(s) 106 the IC 100 may include peripheral or periphery logic devices 108, such as input/output devices (I/Os) to read and write to the memory core(s) and communicate with a host computer or system, and a number of body-bias and power regulators or supplies (collectively 110) through which, for example, voltage, current or power are supplied to the memory core and periphery logic. In one embodiment, the PVT control system 102 includes a microcontroller or controller 112, one or more environmental sensors 114 and test structures 116.

It is noted that the size or area of the PVT control system 102 shown in FIG. 1 is exaggerated for purposes of illustration only, and the PVT control system can occupy an area of about 0.5 mm$^2$ or less depending on specific elements or devices included in the PVT control system. Thus, the PVT control system 102 of the present disclosure includes an area, excluding body-bias and power regulators or supplies, of less than about 0.4% of the IC 100 depending on the area of the IC. For example, in one embodiment the PVT control system 102 occupies an area of about 0.32 mm$^2$ which represents an area of about 0.4% of a 72 megabyte (Mb) SRAM IC.

Figure 2:
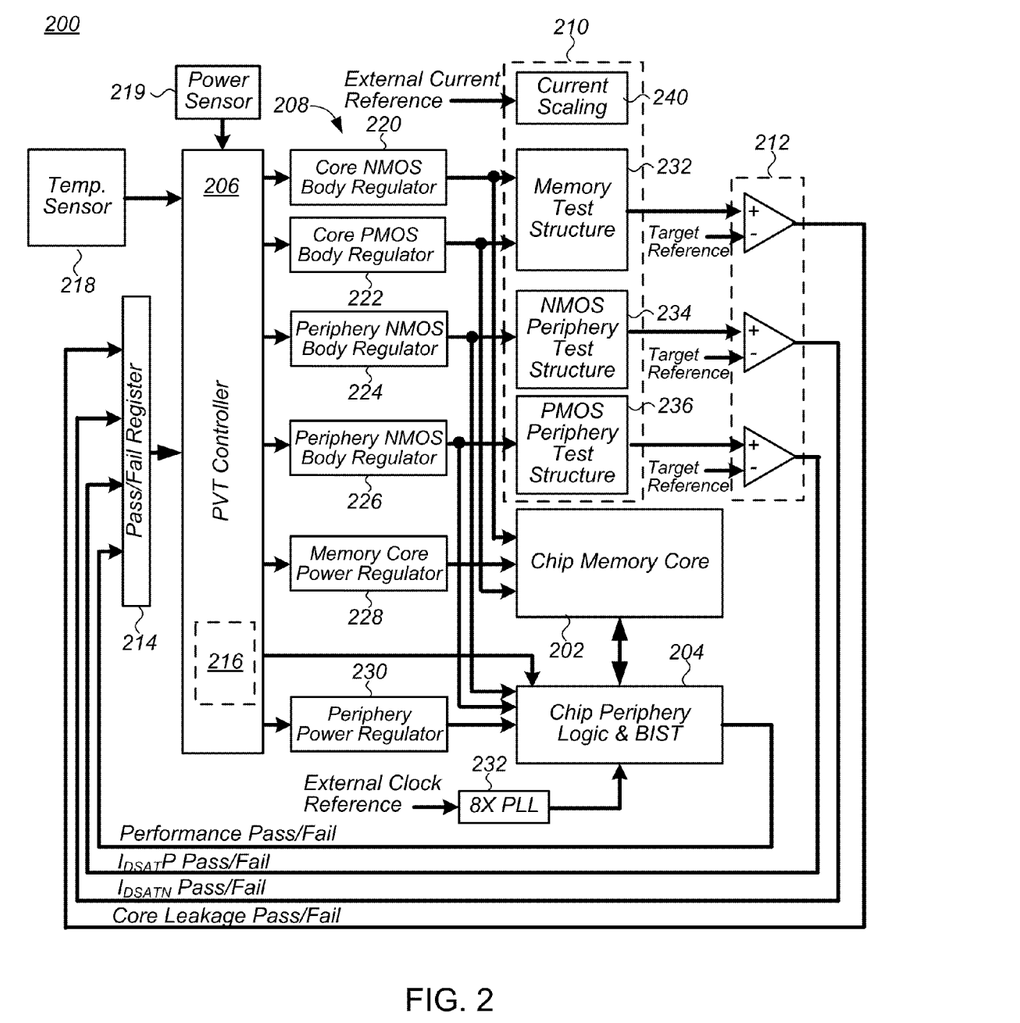
FIG. 2 a block diagram of an IC including a PVT control system according to one embodiment.

A block diagram of an IC including a PVT control system 200 is shown in FIG. 2. In the embodiment shown, the IC is a semiconductor memory IC and further includes a memory core 202, comprising a number of memory cells, each with a number of N type metal-oxide-semiconductor (NMOS) and P type metal-oxide-semiconductor (PMOS) devices or transistors, and periphery logic 204 with a built in self test (BIST).

Referring to the embodiment depicted in FIG. 2, the PVT control system 200 may include a controller or microcontroller 206 including access or control of one or more power and body-bias generators or regulators 208 on the die, a number of on-chip test structures 210 coupled to outputs of one or more of the regulators 208 to estimate and provide measured operational parameters for the memory core 202 and periphery logic 204. The PVT control system 200 may further include a number of comparators 212 to compare outputs of the test structures to target reference values for at least some of the operational parameters of the IC. For example, in the embodiment shown the target reference values can include a target reference for subthreshold leakage of the memory cells or devices in the memory core 202, and separate target references for saturation current ($I_{DSAT}$) of the NMOS and PMOS transistors or devices in the periphery logic 204. Generally, the target reference values are supplied through the microcontroller 206 either from a register or memory 216 in the microcontroller (as shown) or from a separate, discrete memory in the IC (not shown). In various embodiments, the target reference values can be preloaded into the memory 216 of the microcontroller 206, determined from an initial calibration performed at wafer sort or can be entered or altered following fabrication and initial calibration of the IC. That is the target reference values, which are a subset of the operational parameters specified for the IC, can be entered or altered by a user or supplier of the IC. It will further be appreciated that the target values may be scaled down from the operational parameters for the IC in view of the smaller test structures 210 as compared to the actual chip memory core 202 and chip periphery logic and BIST 204.

The PVT control system may further include a pass/fail register 214 to receive and store results of the on-chip tests from the comparators 212 and couple these results to the microcontroller 206. The register 214 can comprise a separate, discrete component in the PVT control system as shown, or a dedicated addressable portion of the larger memory 216 in the microcontroller 206 used to store calibration and binary search algorithms, target reference values and calibrated regulator voltages.

In certain embodiments, the PVT control system 200 further includes one or more environmental sensors (e.g., environmental sensors 114) to sense environmental conditions, such as a temperature of the IC, voltage or electrical current supplied to the IC. In the embodiment shown in FIG. 2 the environmental sensors include but are not limited to one or more temperature sensors 218 to sense or measure a temperature of the die in one or more locations, and one or more power sensors 219 to sense or measure voltage and current of electrical power supplied to the IC.

In one embodiment, the PVT control system 200 compares values for the sensed environmental conditions to values stored in the memory 216 and dynamically adjusts outputs of one or more of the regulators 208 during operation of the IC to compensate for variations in the sensed environmental conditions. The values stored in memory 216 can be preloaded into the memory of the microcontroller 206 along with the target reference values and other operational parameters, determined from an initial calibration performed under controlled environmental conditions, i.e., at a specified temperature, voltage and current, or entered or altered by a user or supplier following fabrication and initial calibration of the IC.

Output signals from the environmental sensors can be continuously received and monitored by the microcontroller 206, or can be polled or sampled at intervals by the microcontroller. For example, power sensors 219 to sense or measure voltage and current of electrical power supplied to the IC can be operated to provide a continuous signal to the microcontroller 206, while the temperature sensors 218 are sampled at regular or irregular intervals over time. Optionally, the microcontroller 206 or the temperature sensors 218 can integrate the signals from individual temperature sensors to provide an average temperature across the die or over time, thereby eliminating unnecessary adjustments to the regulators 208 due to spurious temperature measurements.

The regulators 208 controlled by the microcontroller 206 may include a core NMOS body-bias generator or regulator 220, a core PMOS body-bias regulator 222, a periphery NMOS body-bias regulator 224, a periphery PMOS body-bias regulator 226, a memory core power regulator 228 through which power is supplied to the memory core 202, and a periphery power regulator 230 through which power is supplied to devices in the periphery logic 204. The core NMOS body-bias regulator 220 may provide a body-bias voltage (VNBC) to NMOS transistors in the memory core 202. The core PMOS body-bias regulator 222 may provide a body-bias voltage (VPBC) to PMOS transistors in the memory core. The periphery NMOS body-bias regulator 224 may provide a body-bias voltage (VNBP) to NMOS transistors in the periphery logic 204, and the periphery PMOS body-bias regulator 226 may provide a body-bias voltage (VPBP) to PMOS transistors in the periphery logic. The microcontroller 206 may independently control the core NMOS and PMOS body-bias regulators 220, 222, to reduce subthreshold leakage of the memory cells or devices in the memory core 202, and may independently control the periphery NMOS and PMOS body-bias regulators 224, 226, to adjust saturation current ($I_{DSAT}$) of the transistors or devices in the periphery logic 204. The microcontroller 206 may control the memory core power regulator 228 to meet speed and subthreshold leakage parameters for the IC, and may control the periphery power regulator 230 to compensate for timing shifts due to resistance-capacitance (RC) interconnect variations.

In one embodiment, the microcontroller 206 has full access to all regulators 208 on the die. At wafer sort every die is calibrated at a predefined temperature to target parameters for the IC including subthreshold leakage, FET saturation current ($I_{DSAT}$) and speed. To reduce test costs the PVT control system 200 may use the microcontroller 206 to calibrate for each parameter independently requiring only an external current reference with ±1% accuracy and a clock source with 80 MHz maximum frequency. The clock may be multiplied internally using a phase locked loop (PLL) 232 to operate the BIST at full speed. The PVT control system 200 may independently calibrate all body-bias and power regulators to compensate for variations in memory core N/P body-bias (VNBC, VPBC) and periphery logic N/P body-bias (VNBP, VPBP). The memory core power regulator 228 can be varied to meet speed and leakage requirements. The periphery power regulator 230 may be controlled to adjust periphery power (VPWRP) to compensate for timing shifts due to RC interconnect variations.

The on-chip test structure 210 may include a memory test structure 234 coupled to the core NMOS and PMOS body-bias regulators 220, 222, to estimate or measure subthreshold leakage of the memory cells or devices in the memory core 202, an NMOS periphery test structure 236 to estimate or measure saturation current ($I_{DSAT}$) of the NMOS transistors in the periphery logic 204, and a PMOS periphery test structure 238 to estimate or measure saturation current ($I_{DSAT}$) of the PMOS transistors in the periphery logic. During body-bias calibration at wafer sort a tester (not shown) forces an external current reference that is scaled internally by a current scaling circuit 240 to emulate typical circuit conditions. Further details of the on-chip test structure 210 will now be described with reference to FIG. 3.

Figure 3:
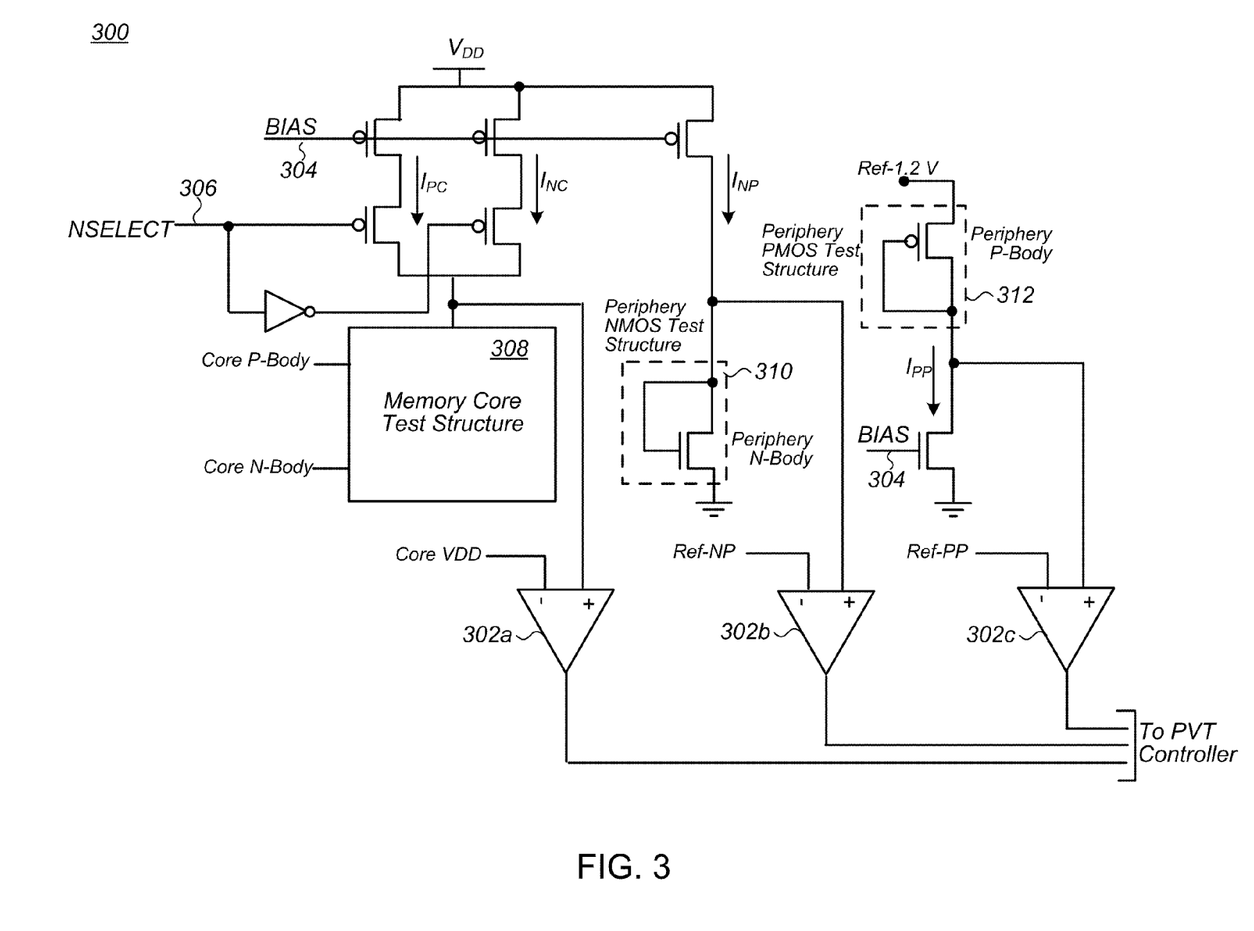
FIG. 3 is a schematic diagram of on-chip test structures in a PVT control system according to one embodiment.

FIG. 3 is a simplified schematic diagram of one embodiment of the on-chip test structures 300 and comparators 302a-c used to calibrate for subthreshold leakage and $I_{DSAT}$ in the IC. The on-chip test structures 300 may include BIAS inputs 304 to enable a reference current to be forced through the test structures during testing, an NSELECT input 306, a memory core test structure 308, a periphery NMOS test structure 310 and a periphery PMOS test structure 312. The memory core test structure 308 may include an array of cells designed to measure NMOS and PMOS leakage components separately. The NSELECT may select between a core NMOS target leakage ($I_{NC}$) current and a core PMOS target leakage ($I_{PC}$) current to be forced through the memory core test structure 308 to measure core NMOS or PMOS leakage components. An output voltage from the memory core test structure 308 is compared by a comparator 302a to a target reference value—Core VDD. The periphery NMOS test structure 310 includes an NMOS transistor coupled between ground and a periphery power supply in a source follower (SF) configuration. The periphery NMOS test structure 310 is connected so that a periphery NMOS target saturation current ($I_{NP}$) forced through the periphery NMOS test structure and an output voltage from the SF compared by a comparator 302b to a target reference value or Ref-NP. The periphery PMOS test structure 312 includes an PMOS transistor coupled between ground and a reference power supply in a SF configuration so that a periphery PMOS target saturation current ($I_{PP}$) forced through the periphery PMOS test structure and an output voltage from the SF compared by a comparator 302c to a target reference value or Ref-PP.

Figure 4A:
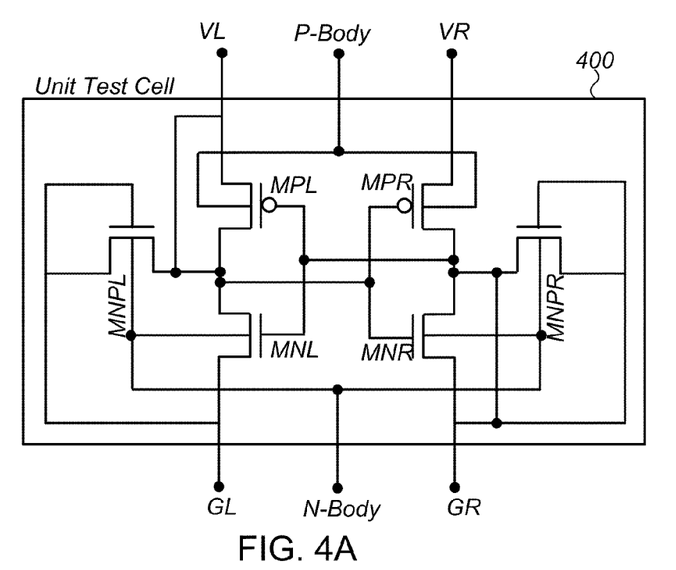
FIG. 4A is a schematic diagram illustrating an embodiment of a memory test structure used to separately measure subthreshold leakage for P type and N type metal-oxide-semiconductor devices (PMOS and NMOS) in a memory core.
Figure 4B:
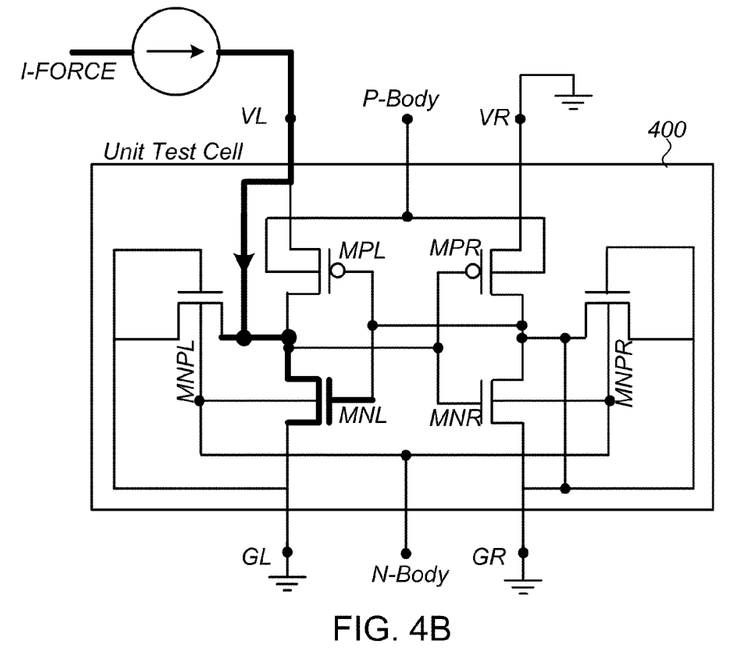
FIG. 4B is an embodiment of the memory test structure of FIG. 4A configured in an NMOS leakage mode.
Figure 4C:
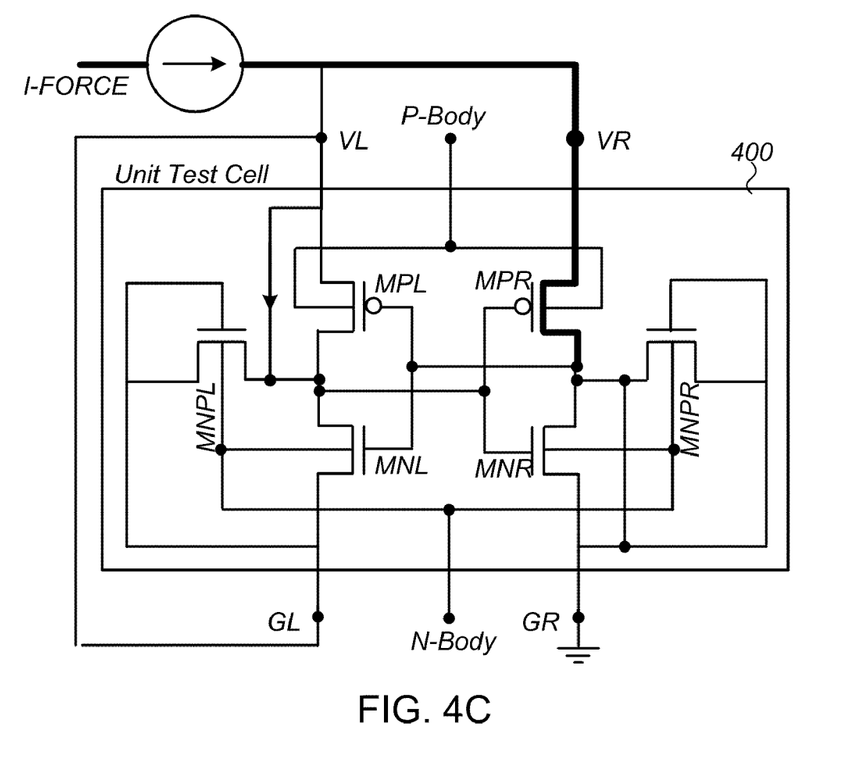
FIG. 4C is an embodiment of the memory test structure of FIG. 4A configured in an PMOS leakage mode.

FIGS. 4A to 4C illustrate details of an embodiment of a single unit test cell 400 in the memory core test structure in different measurement modes. Referring to FIG. 4A, in the embodiment shown the unit test cell 400 layout comprise a 6T SRAM architecture that is substantially the same as that of memory cells in the memory core up to at least the first metal interconnect layer to keep cell layout intact and to reflect true process variations of the memory core. PMOS devices, including transistors MPL and MPR, have body-bias terminals coupled to a core PMOS body-bias (P-BODY). NMOS devices, including transistors MNL, MNR, MNPL and MNPR, have body-bias terminals coupled to a core NMOS body-bias (N-BODY). Referring to FIG. 4B, in NMOS leakage mode gates of devices MNL and MNPL are tied low (off mode) and the forced current (I-FORCE) passes through MNL and MNPL. Assuming that MNR gate leakage and FETs source/drain junction diode leakage components are insignificant, the forced current passed through devices represents the cell's NMOS (pull down+pass gate) subthreshold leakage component. Referring to FIG. 4C, in PMOS leakage mode the gate of MPR tied to the source (VL) (off mode), and the forced current (I-FORCE) passes through MPR. Assuming that MPR gate leakage and FETs source/drain junction diode leakage components are insignificant, the forced current passed through the cell 400 represents the cell's PMOS subthreshold leakage component.

Embodiments of methods for operating an IC including a PVT control system and/or for calibrating regulators of the IC to increase parametric yield will now be described with reference to the flow chart of FIG. 5 and block diagram of FIG. 2.

Figure 5:
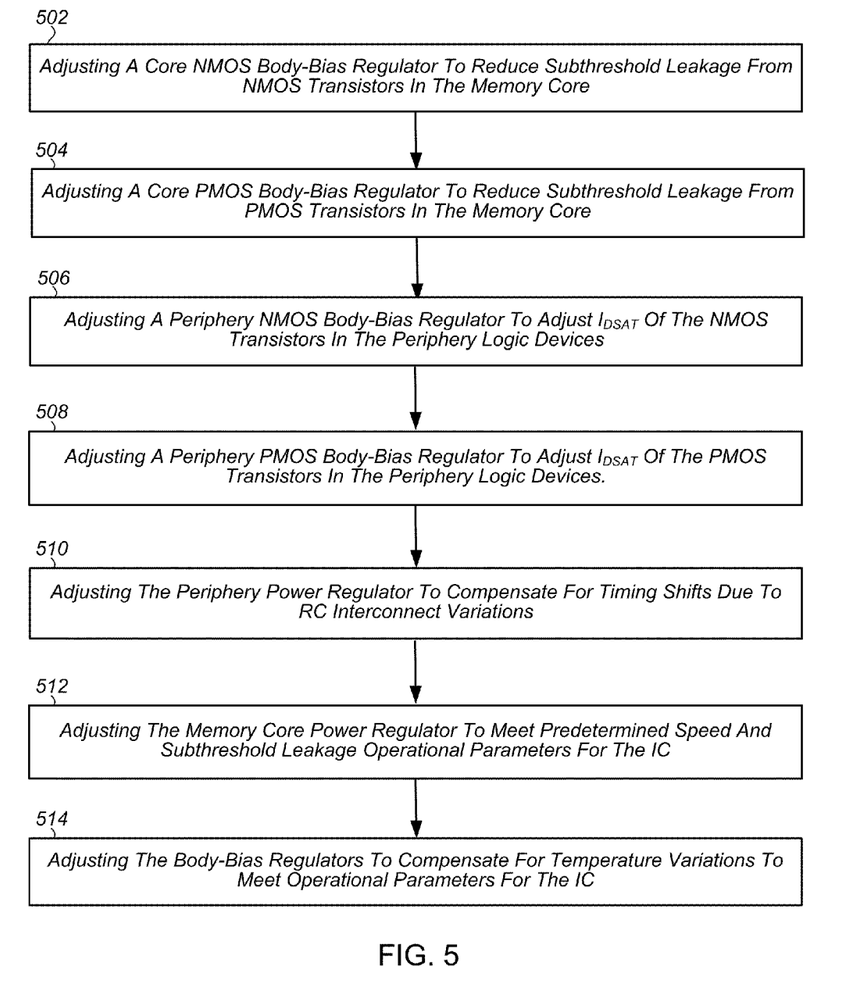
FIG. 5 is a flow chart of a method calibrating and/or operating an IC including a PVT control system according to one embodiment.
Figure 6A:
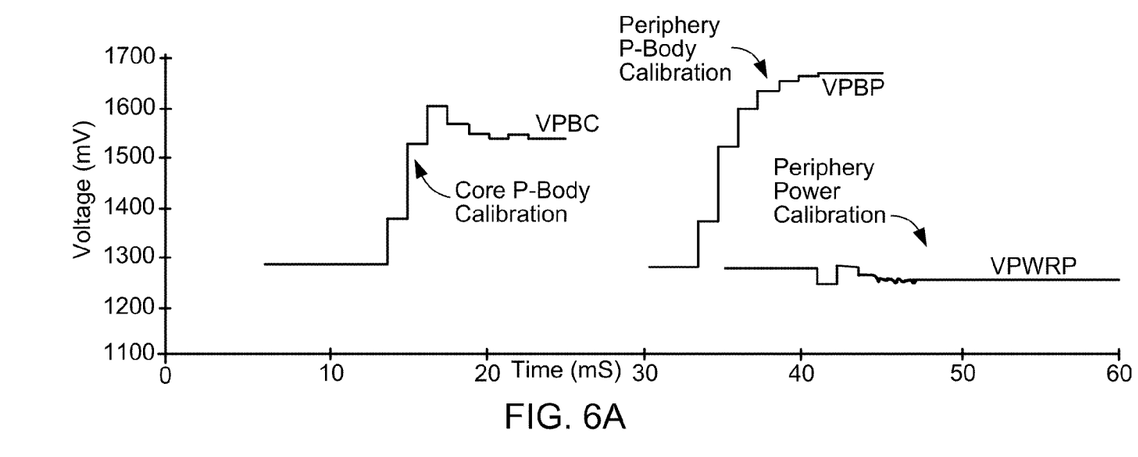
FIGS. 6A and 6B are plots of internal voltages in an IC during calibration according to one embodiment.
Figure 6B:
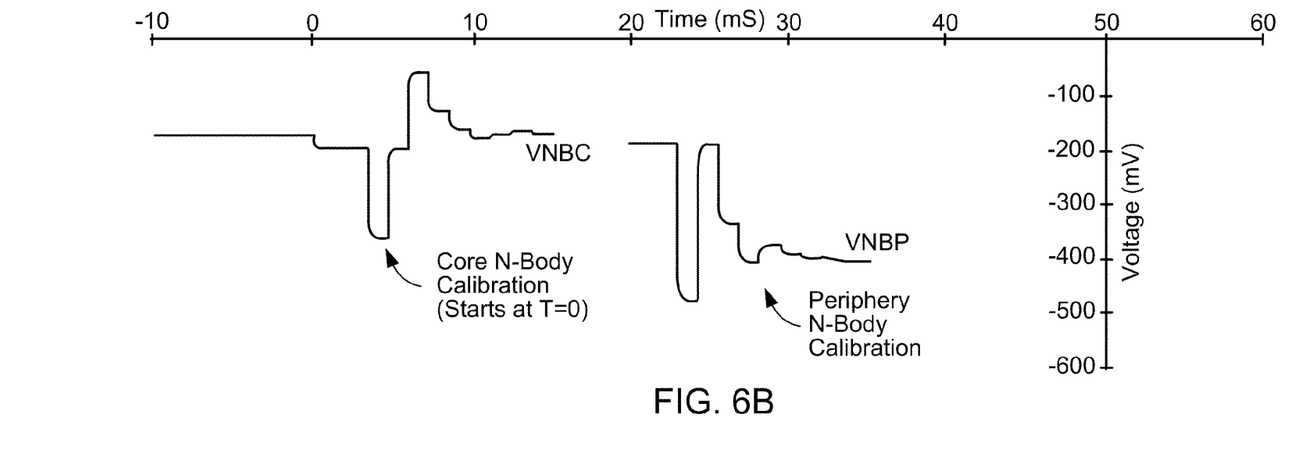

Referring to FIG. 5, in a first block or step, the method begins with adjusting the core NMOS body-bias regulator 220 to reduce subthreshold leakage from NMOS transistors in the memory core 202 (block 502). In one embodiment, this accomplished by forcing a typical current value into the memory test structure 232 and comparing the voltage across the memory test structure against an actual memory core power supply voltage (target reference) using a comparator (e.g., comparators 212). The microcontroller 206 receives feedback from the comparator 212, and adjusts the core NMOS body-bias regulator 220 (VNBC) based on a binary search algorithm stored in the memory 216 in the microcontroller 206 to converge on a solution, where the subthreshold leakage is acceptable and voltage across the memory test structure 232 is within about 5 mV of the memory core power supply voltage (target reference). The microcontroller 206 then may use the same algorithm to adjust the core PMOS body-bias regulator 222 to reduce subthreshold leakage from PMOS transistors in the memory core 202 (block 504), to adjust the periphery NMOS body-bias regulator 224 to adjust $I_{DSAT}$ of the NMOS transistors in the periphery logic 204 (block 506), and to adjust the periphery PMOS body-bias regulator 226 to adjust $I_{DSAT}$ of the PMOS transistors in the periphery logic (block 508). The periphery power regulator 230 may be adjusted to compensate for timing shifts due to resistor-capacitor (RC) interconnect variations (block 510). Internal voltage measurements of the body-bias regulators 220, 222, 224, 226, and periphery power regulator 230 during the calibration procedure are shown in FIGS. 6A and 6B. The successively smaller incremental changes in voltage illustrates the effect of the binary search algorithm operating to converge on a solution.

Next, the memory core power regulator 228 and periphery power regulator 230 are adjusted to meet speed and sub-threshold leakage operational parameters for the IC (block 512). In one embodiment, for speed calibration a tester (not shown) provides electrical power including a reference voltage or current to the on-chip test structures 210, and an external clock reference signal that is multiplied internally by the PLL 232. The microcontroller 206 then executes or operates the BIST 204 using a binary search algorithm to adjust the periphery logic power supply 230 and converge on the closest or lowest voltage to meet the operational parameter for speed. This voltage represents the optimum power-delay product at which the IC will meet the operational parameter for speed with the lowest power consumption. Optionally, during normal IC operation the microcontroller 206 may measure the die temperature using one or more on-chip temperature sensor 218 and then may calculate and set body-bias voltages VNBC, VPBC, VNBP and VPBP, according to one or more algorithms or look up tables stored in memory (e.g., microcontroller memory 216) (block 514).

Figure 7:
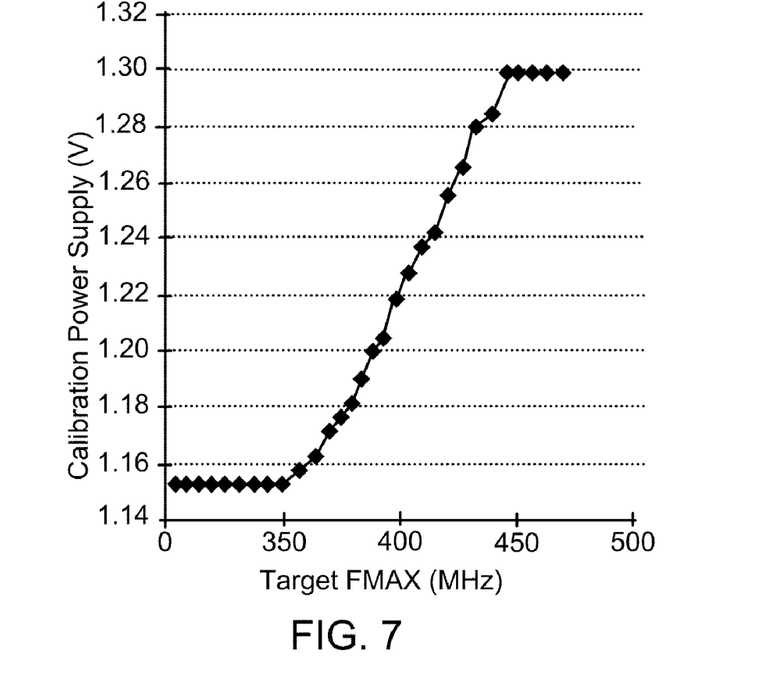
FIG. 7 is a plot of calibration of periphery power (VPWR) versus a targeted speed for one embodiment.
Figure 8:
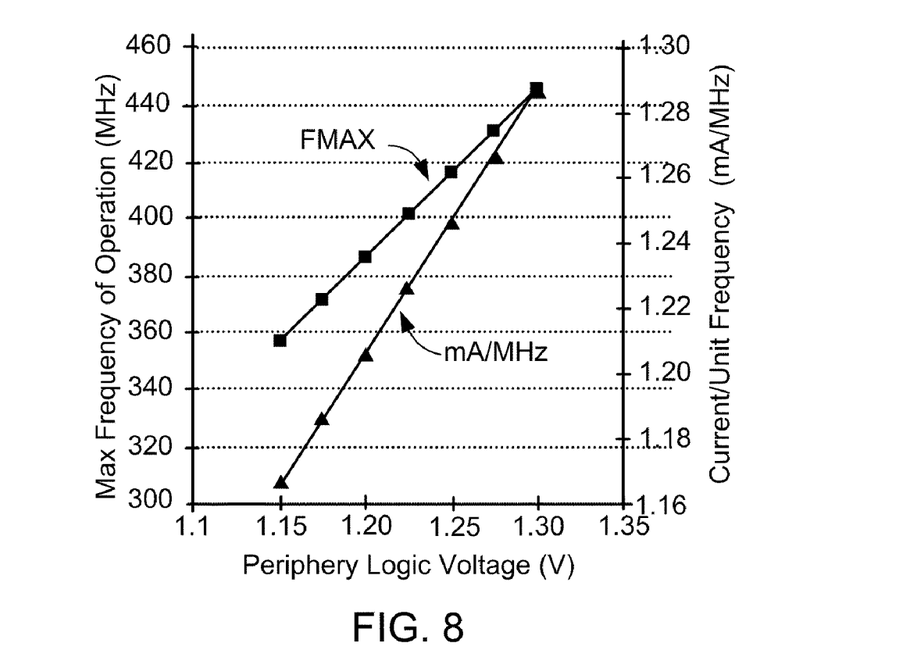
FIG. 8 is a plot of frequency operation versus VPWR illustrating lower normalized VPWR levels versus power consumed for one embodiment.

FIG. 7 shows an example of calibrated power supply voltage (VPWRP) values versus different target frequency for a number of calibrated ICs. FIG. 8 shows an example of the measured frequency normalized current consumption (mA-JMHz) vs. VPWRP.

Figure 9:
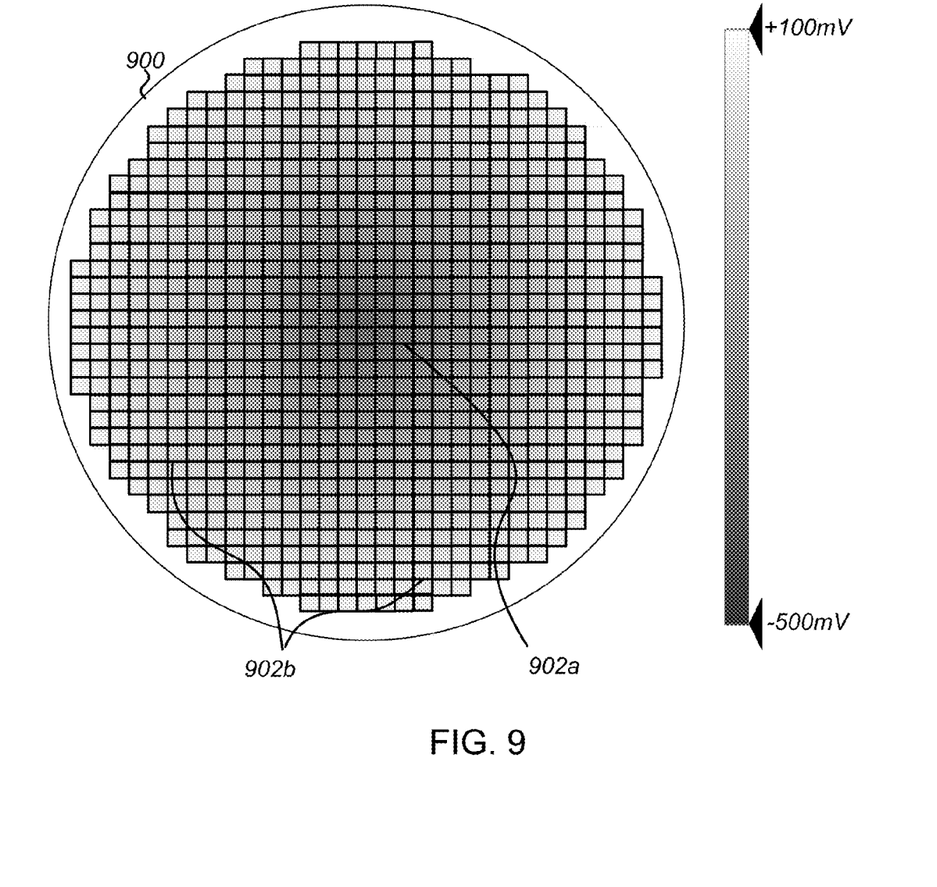
FIG. 9 is a contour plot of NMOS memory core body-bias (VNBC) calibration for a number of IC fabricated on a shared semiconductor substrate showing a process variation gradient over the substrate.

In embodiment, after calibration is complete, the calibrated voltage values may be communicated to the tester and programmed on-chip using non-volatile memory in the microcontroller. FIG. 9 shows an example of a distribution of calibrated NMOS memory core body-bias (VNBC) values across a substrate 900 for a number of IC dies 902, and illustrates the process gradient, according to one embodiment. It is noted that dies 902a in or near the middle of the substrate 900 may have higher subthreshold leakage for the memory core than the target reference values, and hence reverse body-bias may be applied to compensate. Similarly for slower dies 902b on in or near the edge of the substrate 900 may have a leakage lower than the target reference values, and hence a forward bias may be applied to increase speed.

Figure 10:
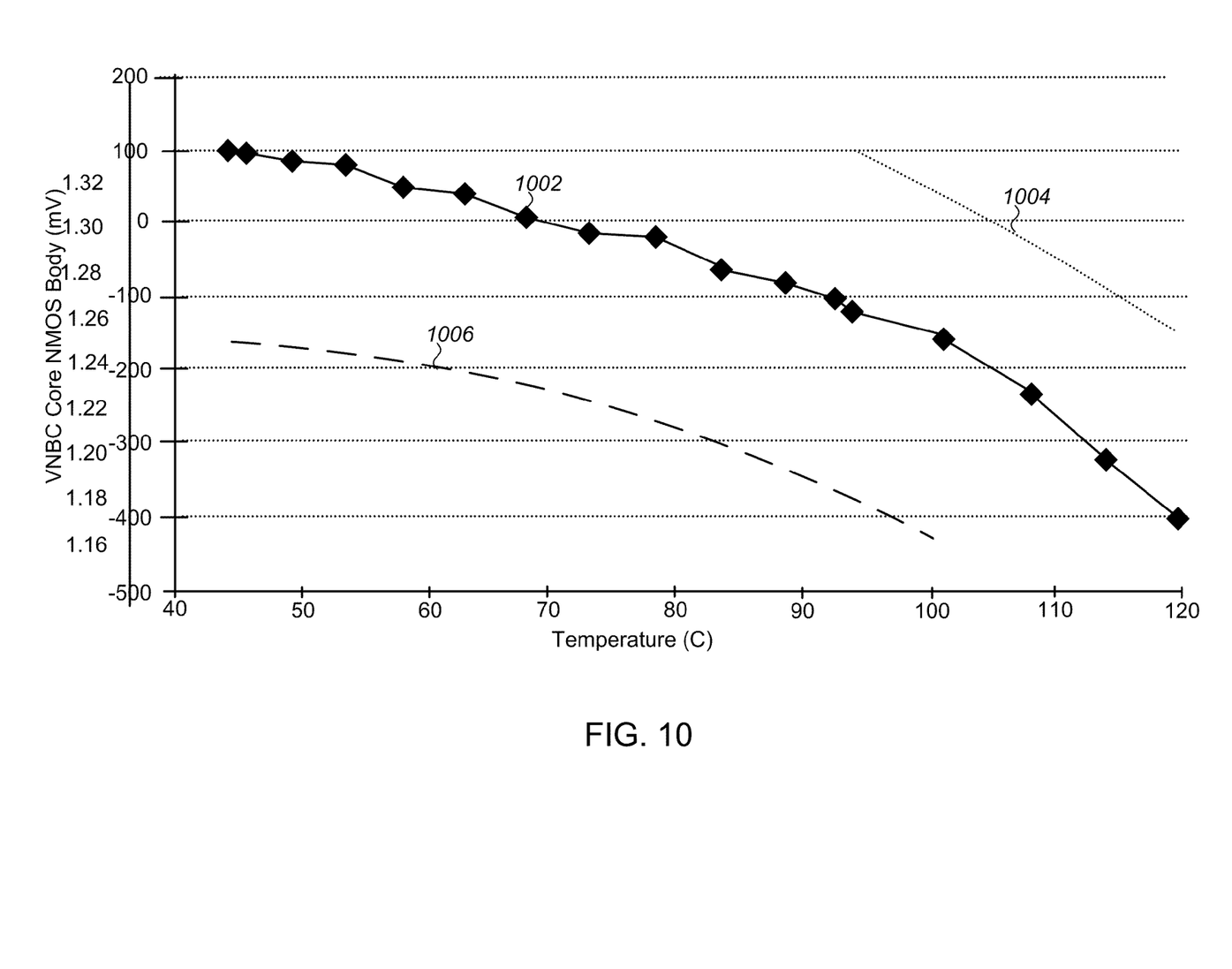
FIG. 10 is a plot of NMOS memory core body-bias versus die temperature for one embodiment.

As noted above, during normal IC operation the microcontroller 206 may measure the die temperature using an on-chip temperature sensor 218 and then may calculate and set body-bias levels according to one or more algorithms stored in memory, such as the microcontroller memory 216. These algorithms may determine the body-bias levels to preserve leakage and performance parameters over temperature, and may include transfer functions with different slopes that can be programmed at sort using non-volatile elements in the microcontroller. Body-bias versus temperature transfer functions may be constructed based on silicon characterization data. FIG. 10 is a plot showing an example of memory core body-bias over die temperature during IC operation. Points on the line labeled 1002 represent measured NMOS memory core body-bias versus die temperature. The line labeled 1004 represents a simulated VNBC versus die temperature transfer function to keep leakage within target values for slow-slow (SS) process corner. The line labeled 1006 represents a simulated VNBC versus die temperature transfer function to keep leakage within target values for a fast-fast (FF) process corner.

In one embodiment, to keep operation smooth across all voltage domains the microcontroller (e.g., microcontroller 206) may include a program (e.g., firmware) that incorporates safety procedures that only allow small incremental changes to any regulator (e.g., core NMOS body bias regulator 220, core PMOS body bias regulator 222, periphery NMOS body bias regulator 224, periphery PMOS body bias regulator 226, memory core power regulator 228 or the periphery power regulator 230) this prevents noise or numerical errors that may cause any systematic or sudden changes of large magnitude that can disturb the IC operation. In one embodiment, the microcontroller 230 incorporates a hardware watchdog circuit that prevents the PVT control system 200 from residing in an undefined state. The watchdog circuit expects reload signals from the executing program at regular intervals, if the microcontroller (e.g., microcontroller 206) stalls and stops sending reload signals after a within a predetermined period of time the watchdog circuit a timer will time out indicating a lockup state, and the watchdog circuit then intervenes and resets the PVT control system 200.

It will be appreciated that the above described embodiments of a PVT control system and method allows for achieving tighter distributions by independently controlling and calibrating each domain. It can be used to control the leakage current, optimize power-delay and reduce power consumption at a given frequency based on a maximum frequency specification. Measurements of ICs calibrated using the PVT control system and method show a 10% saving in current/MHz over the full periphery power supply range of from about 1.29 mA/MHz to about 1.17 mA/MHz.

It will further be appreciated that digital based control of body-bias and power regulators of embodiments of the PVT control system provide a very high level of flexibility, facilitating debugging and characterization, and allows control for new functions or parameters be added in the future simply by updating the microcontroller firmware or memory.

Thus, embodiments of an IC including a microcontroller and methods for operating the same have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

In the forgoing description, for purposes of explanation, numerous specific details have been set forth in order to provide a thorough understanding of the PVT control system and method of the present disclosure. It will be evident however to one skilled in the art that the present interface device and method may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the PVT control system or method. The appearances of the phrase "one embodiment" in various places in the specification do not necessarily all refer to the same embodiment. The term "to couple" as used herein may include both to directly electrically connect two or more components or elements and to indirectly connect through one or more intervening components.

What is claimed is:

1. A method of optimizing operation of an integrated circuit (IC) comprised of devices and sub-circuits, the method comprising:
   receiving in the IC electrical power and information on at least one of one or more operational parameters of the IC; and
   adjusting one or more operating characteristics of at least one of the devices and sub-circuits in the IC based on the received information using a controller integrally formed on a shared die with the IC.

2. The method of claim 1, wherein the IC comprises one or more environmental sensors to sense environmental conditions including one or more of temperature of the IC, voltage and current supplied to the IC, and wherein adjusting operating characteristics of at least one of the devices and sub-circuits further comprises receiving in the controller output signals from the one or more environmental sensors and adjusting operating characteristics of at least one of the devices and sub-circuits in response thereto.

3. The method of claim 1, wherein the IC comprises on-chip test structures and comparators to measure and compare operating characteristics of the one or more devices and sub-circuits to reference values stored in the IC, and wherein adjusting operating characteristics of the one or more devices and sub-circuits further comprises receiving in the controller output signals from the on-chip test structures and comparators and adjusting operating characteristics of at least one of the devices and sub-circuits in response thereto.

4. The method of claim 1, wherein the IC is one of a plurality of ICs on an undiced substrate, and wherein adjusting operating characteristics of at least one of the devices and sub-circuits comprises adjusting operating characteristics of at least one of the devices and sub-circuits to compensate for variations in operating characteristics of the one or more devices and sub-circuits across the substrate due to process variations across the substrate.

5. The method of claim 1, wherein the one or more devices and sub-circuits for which the operating characteristics are adjusted comprise one or more power regulators, body-bias generators, current references, voltage references, current scaling circuits, delay-circuits, built-in-self-test (BIST) circuits and phase (PLLs).

6. The method of claim 5, wherein the operating characteristics adjusted using the controller comprise one or more voltages, currents, time delays and frequency multiplication factors.

7. The method of claim 1, wherein receiving in the IC electrical power and information on at least one of one or more operational parameters of the IC comprises receiving a clock signal.

8. The method of claim 1, wherein the electrical power received in the IC comprises a reference voltage or reference current, and wherein adjusting one or more operating characteristics of at least one of the devices comprises adjusting one or more operating characteristics of at least one of the devices and sub-circuits in the IC based on the reference voltage or reference current.

9. An integrated circuit (IC) comprising:
   a plurality of devices and sub-circuits;
   environmental sensors to sense environmental conditions including one or more of a temperature of the IC, voltage, and current supplied to the IC;
   a controller integrally formed on a shared die with the plurality of devices and sub-circuits to adjust operating characteristics of one or more of the plurality devices and sub-circuits in response to the sensed environmental conditions to meet one or more operational parameters for the IC;
   memory to store reference values for one or more operational parameters for the IC; and
   on-chip test structures and comparators electrically coupled to the controller to measure and compare one or more measured operational parameters for the IC to the stored reference values.

10. The IC of claim 9, wherein the memory further stores operating characteristics of one or more of the plurality of devices and sub-circuits determined using the controller during an initial calibration to compensate for variations in operating characteristics of the plurality of devices and sub-circuits due to process variations across a substrate on which the IC was fabricated.

11. The IC of claim 9, wherein the one or more of the plurality devices and sub-circuits for which the operating characteristics are adjusted comprise one or more power regulators, body-bias generators, current references, voltage references, current scaling circuits, delay-circuits, built-in-self-test (BIST) circuits and phase (PLLs).

12. The IC of claim 9, wherein the IC further comprises a watchdog circuit to reset the controller if the controller fails to adjust operating characteristics of the one or more of the plurality devices and sub-circuits within a predetermined period of time.

13. A method of operating an integrated circuit (IC) comprising a memory core including metal-oxide-semiconductor (MOS) transistors, the method comprising:
   receiving in the IC electrical power and a clock signal; and
   controlling a body-bias regulator in the IC based on the received electrical power and clock signal using a controller integrally formed on a shared die with the IC to reduce subthreshold leakage from the MOS transistors in the memory core.

14. The method of claim 13, wherein the IC includes one or more periphery logic devices including MOS transistors, and wherein the method further comprises controlling a periphery body-bias regulator to adjust saturation current ($I_{DSAT}$) of the MOS transistors in at least one of the periphery logic devices.

15. The method of claim 14, wherein the IC includes a periphery power regulator through which power is supplied to the one or more periphery logic devices, and wherein the method further comprises controlling the periphery power regulator to compensate for timing shifts due to resistance-capacitance (RC) interconnect variations.

16. The method of claim 15, wherein the IC includes a memory core power regulator through which power is supplied to the memory core, and wherein the method further comprises controlling the memory core power regulator to meet operational parameters for the IC including speed and subthreshold leakage.

17. The method of claim 16, wherein the IC comprises one or more environmental sensors to sense environmental conditions including one or more of temperature of the IC, voltage and current supplied to the IC, and wherein the method comprises receiving in the controller output signals from the one or more environmental sensors and controlling the body-bias regulators, the periphery power regulator and the memory core power regulator in response thereto.

18. The method of claim 16, wherein the IC is one of a plurality of ICs on an undiced substrate, and wherein the method comprises controlling the body-bias regulators, the periphery power regulator and the memory core power regulator to compensate for variations in operating characteristics of the MOS transistors in the memory core and periphery logic devices across the substrate due to process variations across the substrate.

* * * * *